(12) United States Patent
Seo

(10) Patent No.: US 6,329,852 B1
(45) Date of Patent: Dec. 11, 2001

(54) POWER ON RESET CIRCUIT

(75) Inventor: Sung Hwan Seo, Seoul (KR)

(73) Assignee: Hyundai Electronics Industries Co., Inc., Kyungki-Do (KR)

( * ) Notice: Subject to any disclaimer, the term of this patent is extended or adjusted under 35 U.S.C. 154(b) by 0 days.

(21) Appl. No.: 09/599,641

(22) Filed: Jun. 23, 2000

(30) Foreign Application Priority Data

Jun. 23, 1999 (KR) .................................................. 99-23700

(51) Int. Cl.$^7$ ...................................................... H03L 1/00
(52) U.S. Cl. .......................................... 327/143; 327/198
(58) Field of Search ................................... 327/142, 143, 327/198, 261, 50, 155, 580, 535, 537; 326/94; 307/126, 130

(56) References Cited

U.S. PATENT DOCUMENTS

| 3,895,239 | * | 7/1975 | Alaspa | 327/143 |
|---|---|---|---|---|
| 4,797,584 | * | 1/1989 | Aguti et al. | 327/143 |
| 5,111,067 | * | 5/1992 | Wong et al. | 327/143 |
| 5,115,146 | * | 5/1992 | McClure | 327/143 |
| 5,151,614 | * | 9/1992 | Yamazaki et al. | 327/143 |
| 5,448,528 | | 9/1995 | Nagai | 365/233 |
| 5,511,034 | | 4/1996 | Hirata | 365/230 |
| 5,552,725 | * | 9/1996 | Ray et al. | 327/143 |
| 5,555,166 | * | 9/1996 | Sher | 363/49 |
| 5,631,867 | | 5/1997 | Akamatsu et al. | 365/189 |
| 5,682,111 | | 10/1997 | Bacrania et al. | 327/143 |
| 5,696,461 | * | 12/1997 | Germini | 327/143 |
| 5,942,925 | | 8/1999 | Stahl | 327/143 |
| 5,959,476 | * | 9/1999 | Pascucci | 327/143 |
| 6,005,423 | * | 12/1999 | Schultz | 327/143 |
| 6,016,068 | * | 1/2000 | Ding | 327/142 |

FOREIGN PATENT DOCUMENTS

| 63-14399 | 1/1988 | (JP) . |
|---|---|---|
| 63233560 | 9/1988 | (JP) . |
| 2189614 | 7/1990 | (JP) . |
| 5022084 | 1/1993 | (JP) . |
| 8-007567 | 1/1996 | (JP) . |
| 8-97695 | 4/1996 | (JP) . |

* cited by examiner

Primary Examiner—Timothy P. Callahan
Assistant Examiner—Hai L. Nguyen
(74) Attorney, Agent, or Firm—Pennie & Edmonds LLP

(57) ABSTRACT

The present invention relates to a power on reset circuit capable of stabilizing an operation of a chip by generating a reset signal regardless of a ramp up time of a power supply voltage, and includes a first means for controlling a potential of a first node to a first potential according to a potential of a second node, a second means for supplying the power supply voltage to be ramped up to the second node according to the potential of the first node, a third means for determining a potential of a third node by inverting and delaying the potential of the second node, a fourth means for controlling a potential of a fourth node to a second potential according to the potential of the third node, a fifth means for inverting and delaying the potential of the fourth node, a sixth means for outputting the potential of the third node to an output terminal according to an output signal from said fifth means and its inverted signal, and a seventh means for controlling a signal of the output terminal according to the inverted signal of the output signal from said fifth means.

9 Claims, 8 Drawing Sheets

POWER ON RESET CIRCUIT

BACKGROUND OF THE INVENTION

1. Field of the Invention

The present invention relates to a power on reset circuit and more particularly, to a power on reset circuit capable of obtaining a stable operation regardless of a ramp up time of a power supply voltage or a process variation.

2. Description of the Prior Art

A flash EEPROM generally includes logic circuits, and after a setup of a power supply voltage, the logic circuits should be initialized with a predetermined state. Thus, a power on reset circuit is used to generate a signal capable of initializing the logic circuits as soon as the power supply voltage is set up.

Hereinafter, a conventional power on reset circuit will be described with reference to FIG. 1.

FIG. 1 is a circuit diagram showing a conventional power on reset circuit, and the construction thereof is as follows.

First to third PMOS transistors P1 to P3 are coupled between a power terminal and a second node Q2. The first PMOS transistor P1 is driven according to a potential of a first node Q1, the second PMOS transistor P2 serves as a diode, and the third PMOS transistor P3, whose a gate terminal is coupled to a ground terminal Vss, is maintained at a turned-on state. First to fifth NMOS transistors N1 to N5 are coupled between the second node Q2 and the ground terminal Vss and are always maintained at a turned-on state since their gate terminals are coupled to the power terminal. A sixth NMOS transistor N6 is coupled between the power terminal and the second node Q2, whose a gate terminal is coupled to the second node Q2. Fourth and fifth PMOS transistors P4 and P5 are coupled between the power terminal and a third node Q3. The fourth PMOS transistor P4 is driven according to a potential of the first node Q1, and the fifth PMOS transistor P5, whose a gate terminal is coupled to the ground terminal Vss, is always maintained at a turned-on state. Seventh to ninth NMOS transistors N7 to N9 are coupled between the third node Q3 and the ground terminal Vss, whose gate terminals are coupled to the second node Q2, respectively. Third and fourth capacitors C3 and C4 are coupled in parallel between the power terminal and the third node Q3. Tenth to thirteen NMOS transistors N10 to N13 are coupled between the third node Q3 and the ground terminal Vss, whose gate terminals are coupled to the first node Q1, respectively. A signal of the third node Q3 is delayed through first to sixth inverters I1 to I6 to output a reset signal RST. Meanwhile, a plurality of serially-coupled PMOS transistors and a fourteenth NMOS transistor N14 are coupled between the power terminal and the first node Q1. Each gate terminal of the serially-coupled PMOS transistors is coupled to the ground terminal Vss. A first capacitor C1 is coupled between the first node Q1 and the ground terminal Vss.

Hereinafter, a driving method of the conventional power on reset circuit will be described.

At an initial state, the first node Q1 is maintained at a low state. Therefore, if the power supply voltage Vcc is applied more than a threshold voltage Vpn of a PMOS transistor, the first and fourth PMOS transistors P1 and P4 are turned on. The power supply voltage Vcc is supplied to the second node Q2 through the turned-on first PMOS transistor P1, the second and third PMOS transistors P2 and P3. However, the second node Q2 is maintained at a low state through the first to fifth NMOS transistors N1 to N5, coupled between the second node Q2 and the ground terminal Vss, whose gate terminals are coupled to the power supply terminal. Since the second node Q2 is maintained at a low state, the sixth NMOS transistor N6 is turned on, so that the power supply voltage Vcc is supplied to the second node Q2 through the sixth NMOS transistor N6. The voltage Vcc is discharged to the ground terminal Vss through the second capacitor C2 so that the second node Q2 is dropped to the ground level. Accordingly, the sixth to ninth NMOS transistors N7 to N9 are turned off, wherein the sixth to ninth NMOS transistors N7 to N9 are coupled between the third node Q3 and the ground terminal Vss, whose gate terminals are coupled to the second node Q2. Meanwhile, the power supply voltage Vcc is supplied to the second node Q2 through the turned-on fourth PMOS transistor P4 and the fifth PMOS transistor P5. Since the seventh to ninth PMOS transistors N7 to N9 are turned off, the second node Q2 is maintained at a high state. Since the tenth to thirteenth NMOS transistors N10 to N13 coupled between the third node Q3 and the ground terminal Vss, whose gate terminals is coupled to the third node Q3, are turned off by a potential of the first node Q1 having the low state, the third node Q3 is maintained at a high state. A signal of the third node Q3 maintained at the high state is delayed through the first to sixth inverters I1 to I6 for a predetermined time to output a reset signal RST, thereby resetting a chip.

The gradually-increasing power supply voltage Vcc is delayed due to a plurality of the serially-coupled PMOS transistors and the first capacitor C1 for a predetermined time and supplied to the first node Q1, and a potential of the first node Q1 is increased due to the voltage. The first and the fourth PMOS transistors P1 and P4 are turned off, so that a supply of the power supply voltage is stopped. The tenth to the thirteenth NMOS transistors N10 to N13 are turned off, so that a potential of the third node Q3 becomes a low state. As a result, since a signal of the low state is outputted through the first to sixth inverters I1 to I6, a reset operation is stopped.

FIGS. 2 and 3 shows the output waveforms of FIG. 1 according to a ramp up time. Here, FIG. 2 is an output waveform when the ramp up time is 5 msec, and FIG. 3 is an output waveform when the ramp up time is 200 msec.

As can be seen from FIG. 2, the power up reset circuit such as shown in FIG. 1 generates the reset signal of approximately 2V for 2msec, when the power supply voltage Vcc is applied and increased. As can be seen from FIG. 3, however, the reset voltage is not generated when the ramp up time is 200 msec. That is, in a slow ramping of 200 msec as an optimized parameter, since the reset signal is not generated, the chip can not be reset.

SUMMARY OF THE INVENTION

It is, therefore, an object of the present invention to provide a power on reset circuit capable of generating a reset signal regardless of a ramp up time of a power supply voltage.

To achieve the above object, the power on reset circuit in accordance with the present invention comprises a first means for controlling a potential of a first node to a first potential according to a potential of a second node, a second means for supplying the power supply voltage to be ramped up to the second node according to the potential of the first node, a third means for determining a potential of a third node by inverting and delaying the potential of the second node, a fourth means for controlling a potential of a fourth node to a second potential according to the potential of the third node, a fifth means for inverting and delaying the potential of the fourth node, a sixth means for outputting the potential of the third node to an output terminal according to an output signal from said fifth means and its inverted signal, and a seventh means for controlling a signal of the output terminal according to the inverted signal of the output signal from said fifth means.

DETAILED DESCRIPTION OF THE PREFERRED EMBODIMENTS

Hereinafter, the present invention will be described in detail with reference to accompanying drawings.

Figure 1:
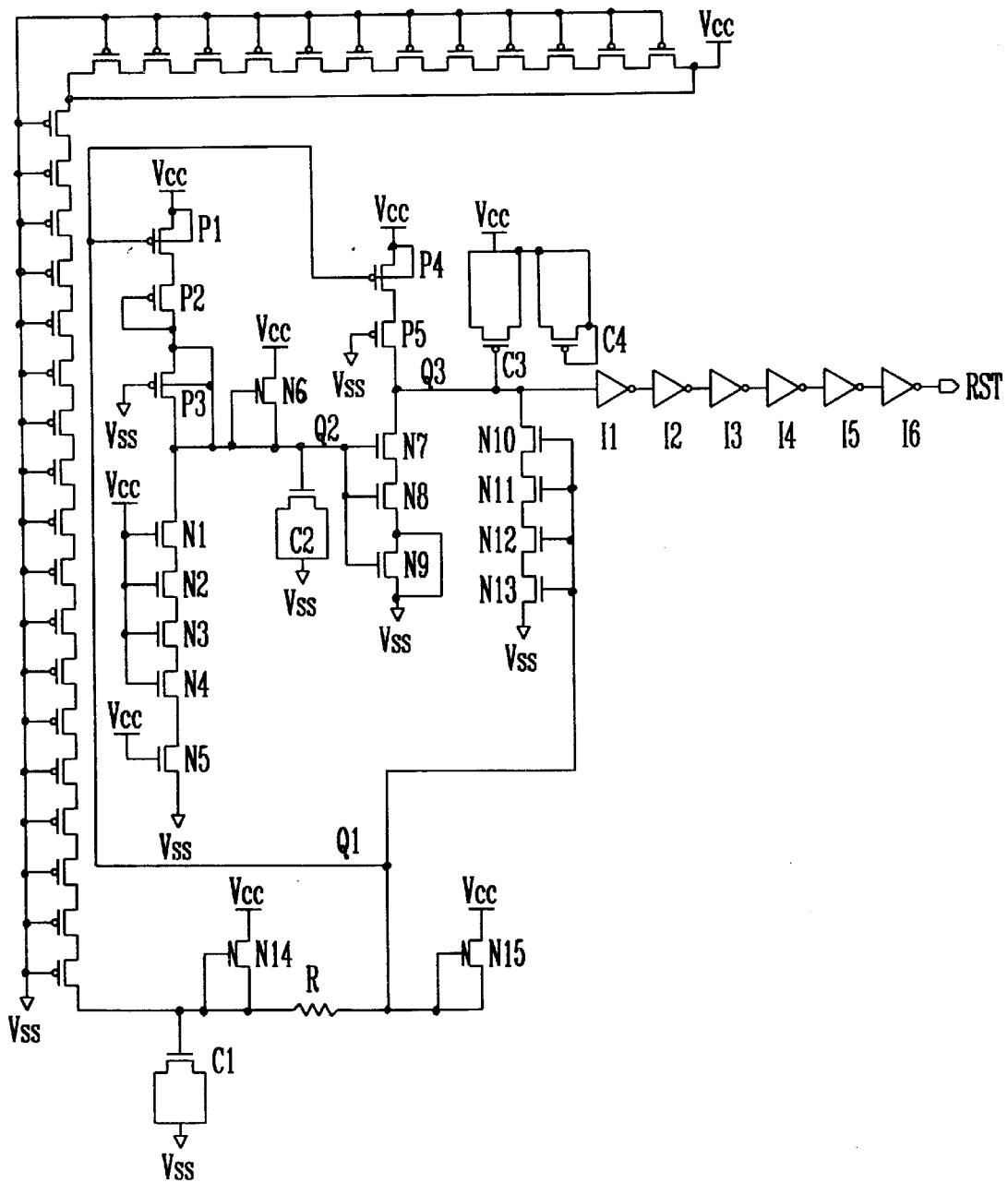
FIG. 1 is a circuit diagram showing a conventional power on reset circuit.
Figure 2:
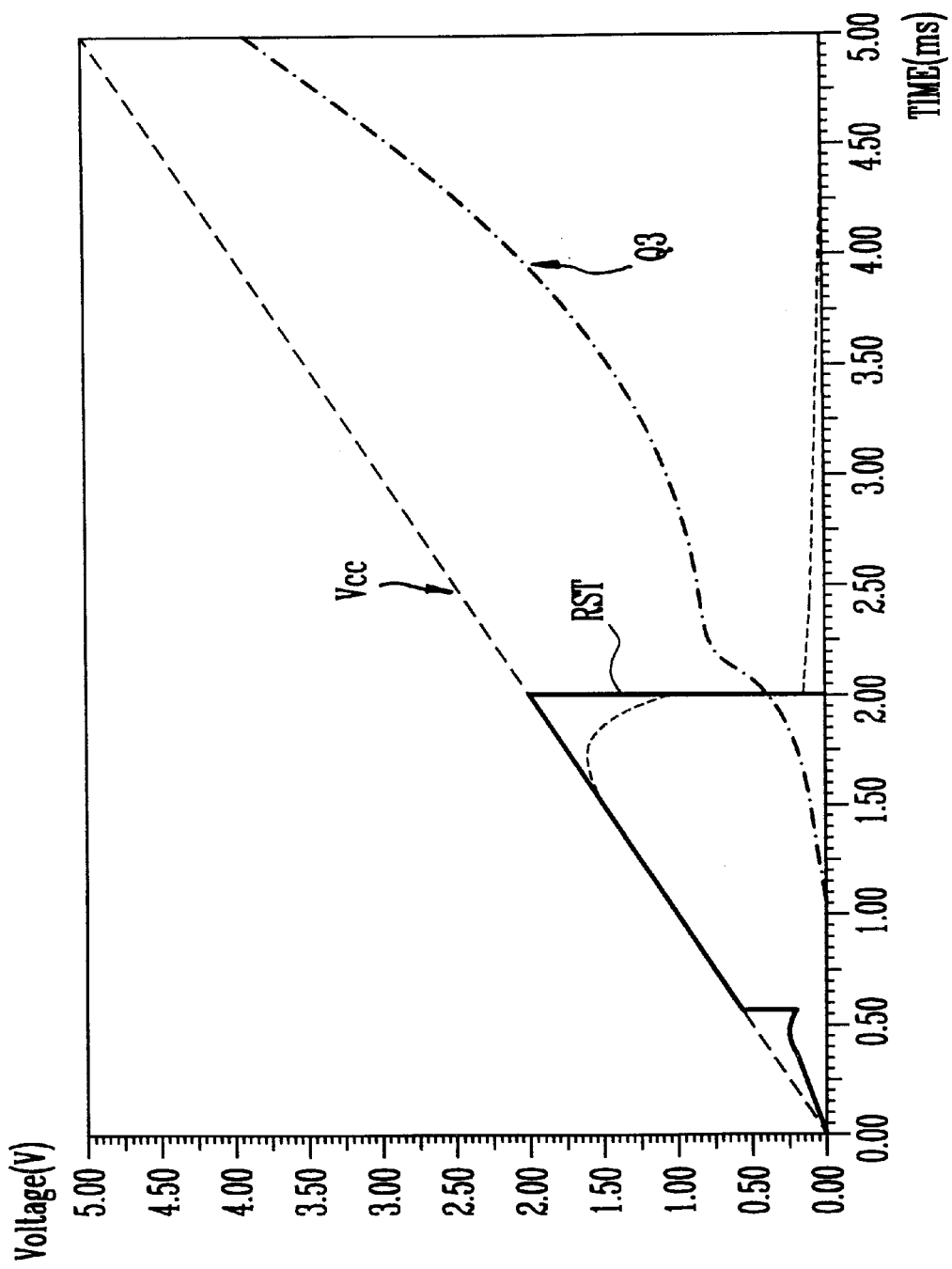
FIGS. 2 and 3 are waveforms explaining an operation of FIG. 1.
Figure 3:
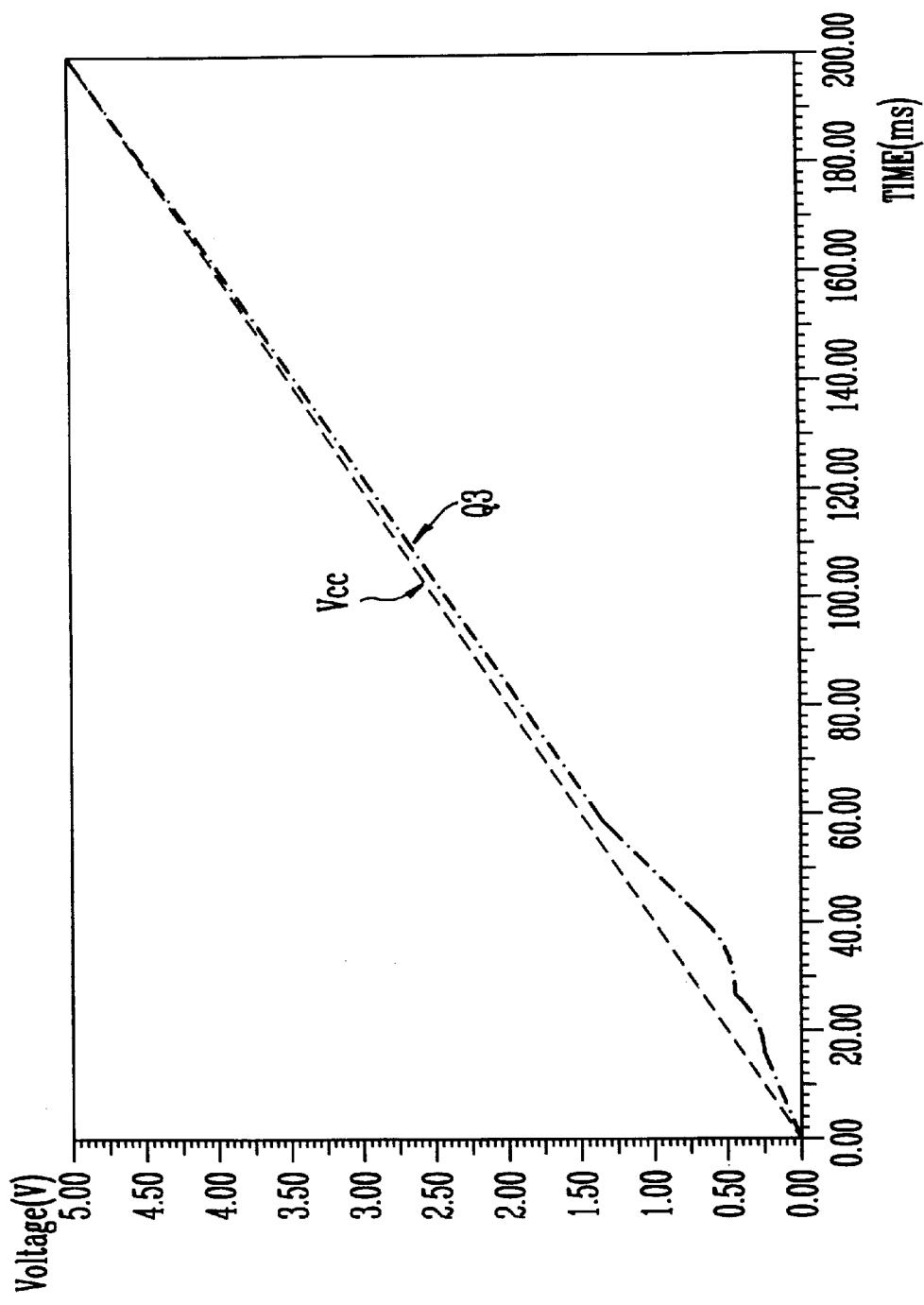
Figure 4:
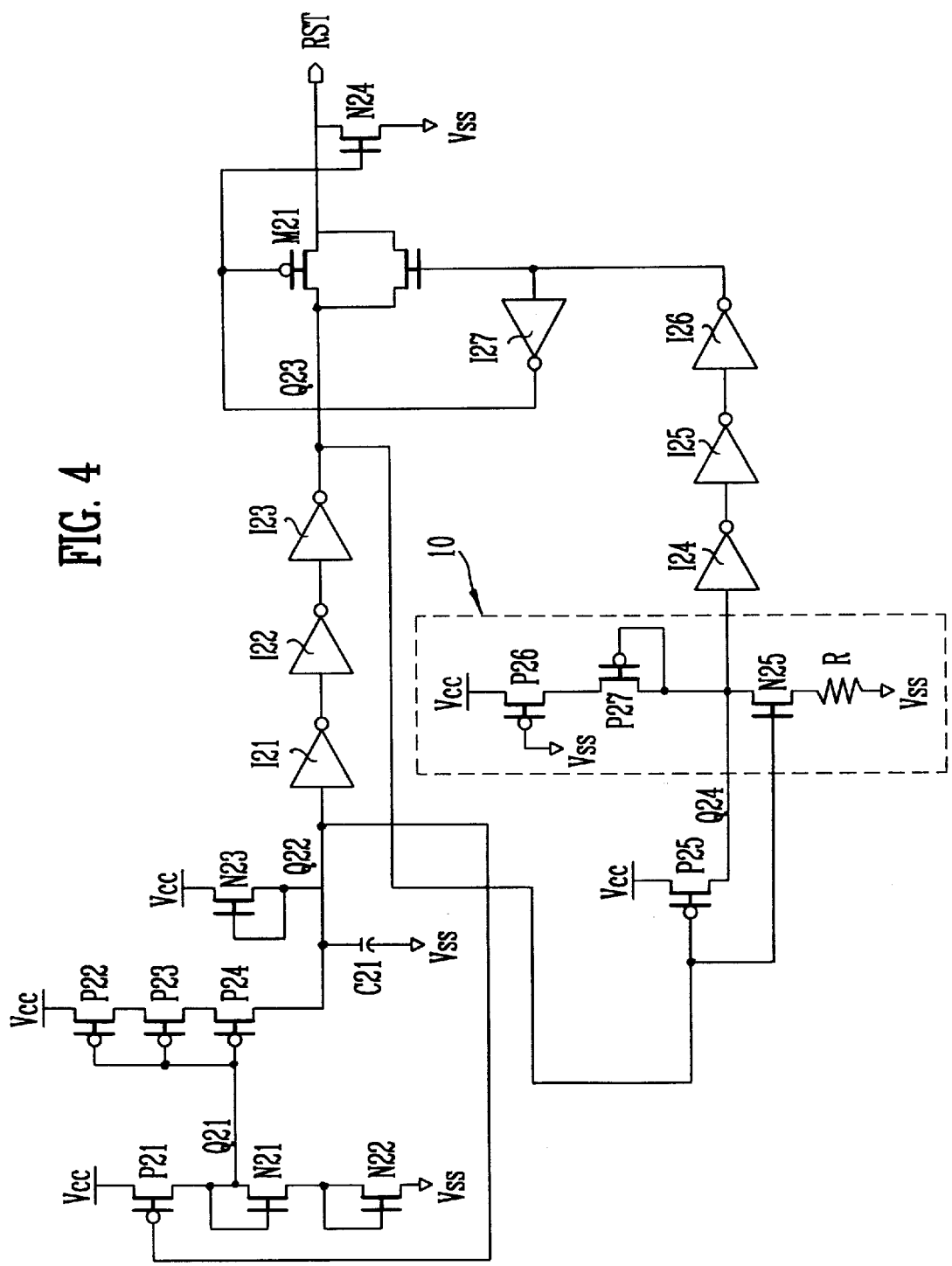
FIG. 4 is a circuit diagram illustrating a power on reset circuit in accordance with the present invention.

In FIG. 4, there is shown a power on reset circuit in accordance with the present invention.

A first PMOS transistor P21 is coupled between a power terminal and a first node Q21 and is driven according to a potential of a second node Q22. First and second NMOS transistors N21 and N22 are coupled between the first node Q21 and the ground terminal Vss and serves as a diode. Second to fourth PMOS transistors P22 to P24 are coupled between the power terminal and the second node Q22 and are driven according to a potential of the first node Q21, respectively. A first capacitor C21 is coupled between the second node Q22 and the ground terminal Vss, and a third NMOS transistor N23 is coupled between the power supply voltage and the second node Q22 and is driven according to a potential of the second node Q22. First to third inverters I21 to I23 determine a potential of the third node Q23 by inverting and delaying the potential of the second node Q22. A fifth PMOS transistor P25 is coupled between the power supply voltage and a fourth node Q24 and is driven according to a potential of the third node Q23. Sixth and seventh PMOS transistors P26 and P27 are coupled between the power terminal and the fourth node Q24. Since a gate electrode of the sixth PMOS transistor P26 is coupled to the ground terminal Vss, the sixth PMOS transistor P26 is always maintained at a turned-on state. Since a gate terminal of the seventh PMOS transistor P27 is coupled to the fourth node Q24, the seventh PMOS transistor P27 is driven according to a potential of the fourth node Q24. A fifth NMOS transistor P25 is coupled between the fourth node Q24 and the ground terminal Vss and is driven according to a potential of the third node Q23. The sixth and seventh PMOS transistors P26 and P27, the fifth NMOS transistor N25, and a resistor R are operated as a power supply voltage detecting unit 10. A potential of the fourth node Q24 is inverted and delayed through the fourth to sixth inverters I24 to I26 and is inputted to an NMOS transistor of a transfer gate M21. Then, the potential of the fourth node Q24 is inverted through the seventh inverter I27 and is inputted to PMOS transistor and a gate terminal of the fourth NMOS transistor N24 coupled between an output terminal and the ground terminal. The reset signal RST is outputted through the transfer gate M21, thereby resetting the chip.

Hereinafter, a driving method of the power on reset circuit in accordance with the present invention will be described.

At an initial state before the power supply voltage Vcc is ramped up, the second node Q22 should have an initial value in order not to rise to over the threshold voltage Vtn. For this, the third NMOS transistor N23 is coupled between the power terminal and the second node Q22, and the first capacitor C21 of above 10pF is coupled between the second node Q22 and the ground terminal in order to stably maintain the initial value of the second node Q22. Since the second node Q22 is maintained at a low state, the third node Q23 has a potential of a high state, wherein the potential of the third node Q23 is determined through the first to third inverters I21 to I23. The fifth PMOS transistor P25 is turned off due to the potential of the third node Q23 maintaining a high state, and the fifth NMOS transistor N25 of the power supply voltage detecting unit 10 is turned on, so that the fourth node Q24 is maintained at a low state. Since the fourth node Q24 maintains a low level, the power supply voltage Vcc is applied by the sixth and seventh PMOS transistors P26 and P27 of the power supply voltage detecting unit 10. However, a path to the ground terminal is formed due to the turned-on fifth NMOS transistor N25, so that the fourth node Q24 is continuously maintained at a low state. The potential of the fourth node Q24 maintaining the low level is inverted and delayed through the fourth to sixth inverters I24 to I26 and is inputted to the NMOS transistor of the transfer gate M21 as a high level. Also, the potential of the fourth node Q24 is inverted as a low state and is inputted to the PMOS transistor of the transfer gate M21, so that the transfer gate M21 is turned on. Meanwhile, the fourth NMOS transistor N24 is turned off due to a signal of a low level from the seventh inverter I27. Accordingly, the reset signal RST is outputted.

Since the second node Q22 maintains a low state, the first PMOS transistor P21 is turned on, and the power supply voltage Vcc is supplied to the first node Q21 when the power supply voltage Vcc to be ramped up is higher than the threshold voltage Vtp of the PMOS transistor. Until the power supply voltage to be supplied becomes 2Vtn, capable of turning on the first and second NMOS transistors N21 and N22, the potential of the first node Q21 is increased. Since the second node Q22 maintains a low level until the potential of the first node Q21 becomes 2Vtn, the reset signal RST is outputted in the same manner as the above-described method.

If the potential of the first node Q21 is continuously increased, and therefore the power supply voltage Vcc is increased to above 2Vtn capable of turning on the first and second NMOS transistors N21 and N22, the potential of the first node Q21 is dropped to the ground voltage. Accordingly, by turning on the second to fourth PMOS transistors P22 to P24, whose gate electrodes are coupled to the first node Q21, the power supply voltage is supplied to the second node Q22. Thus, the second node Q22 is maintained at a high level and the potential of the first node Q21 is inverted and delayed through the first to third inverters I21 to I23 and is supplied to the third node Q23.

Due to the potential of the third node Q23 maintaining a low state, the fifth PMOS transistor P25 is turned on and the fifth NMOS transistor N25 is turned off. Accordingly, the fourth node Q24 is maintained at a high level due to the power supply voltage, which is supplied by the turned-on fifth PMOS transistor P25, and this signal is inverted and delayed through the fourth to sixth inverters I24 to I26 to be inputted to the NMOS transistor of the transfer gate M21 as a low state. The signal is inverted to a high state through the seventh inverter I27 and is inputted to the PMOS transistor of the transfer gate M21, thereby turning off the transfer gate M21. In addition, since the output terminal is dropped to the ground voltage by turning on the fourth NMOS transistor N24, a supply of the reset signal RST is cut off.

Figure 5:
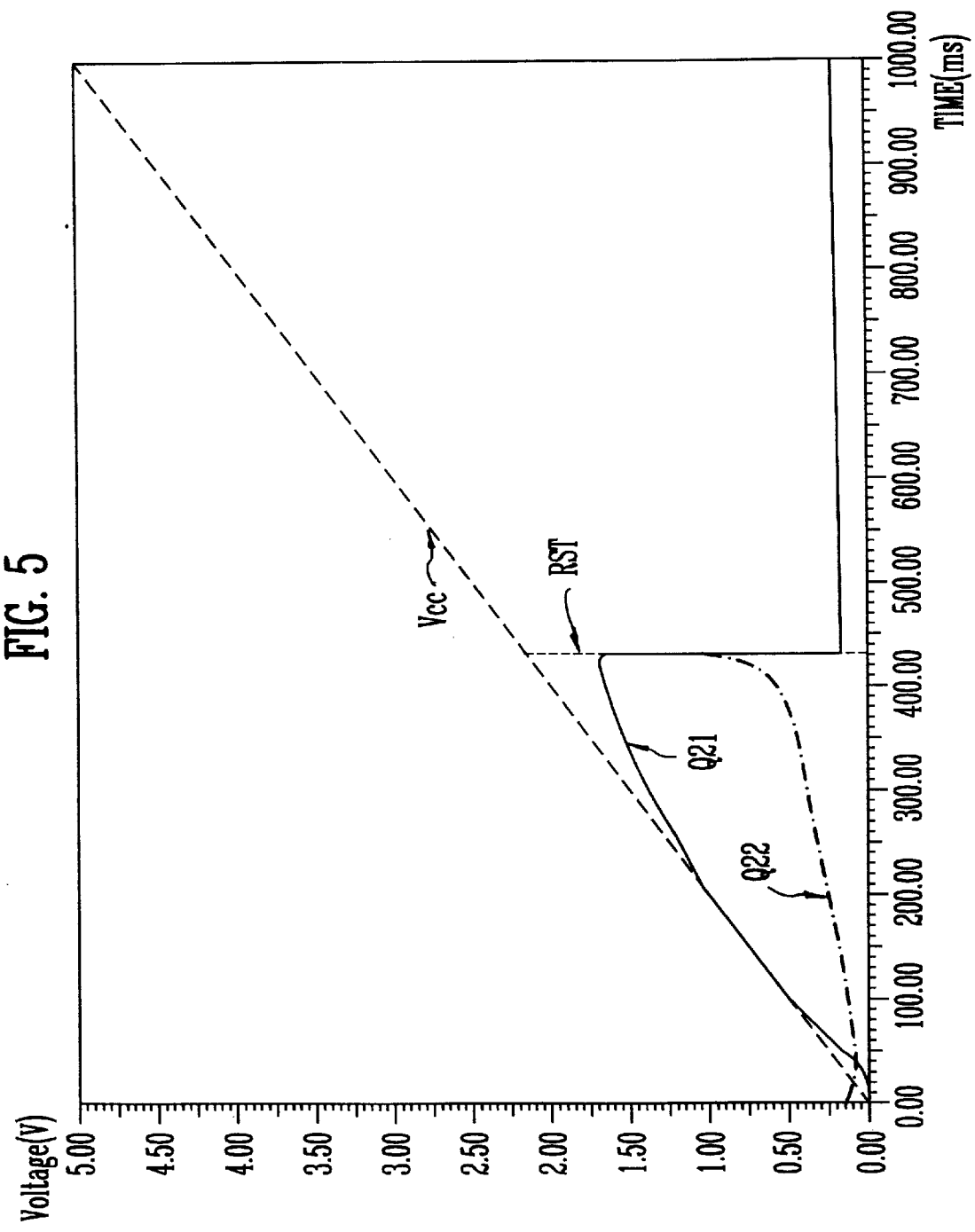
FIGS. 5 and 6 are waveforms explaining an operation of FIG. 4.

FIG. 5 is an output waveform of the power on reset circuit in accordance with the present invention when the ramp up time is 1000 msec. While the power supply voltage Vcc is increased to 5V during 1000 msec, the reset signal of approximately 2.1V is generated during 420 msec.

Figure 6:
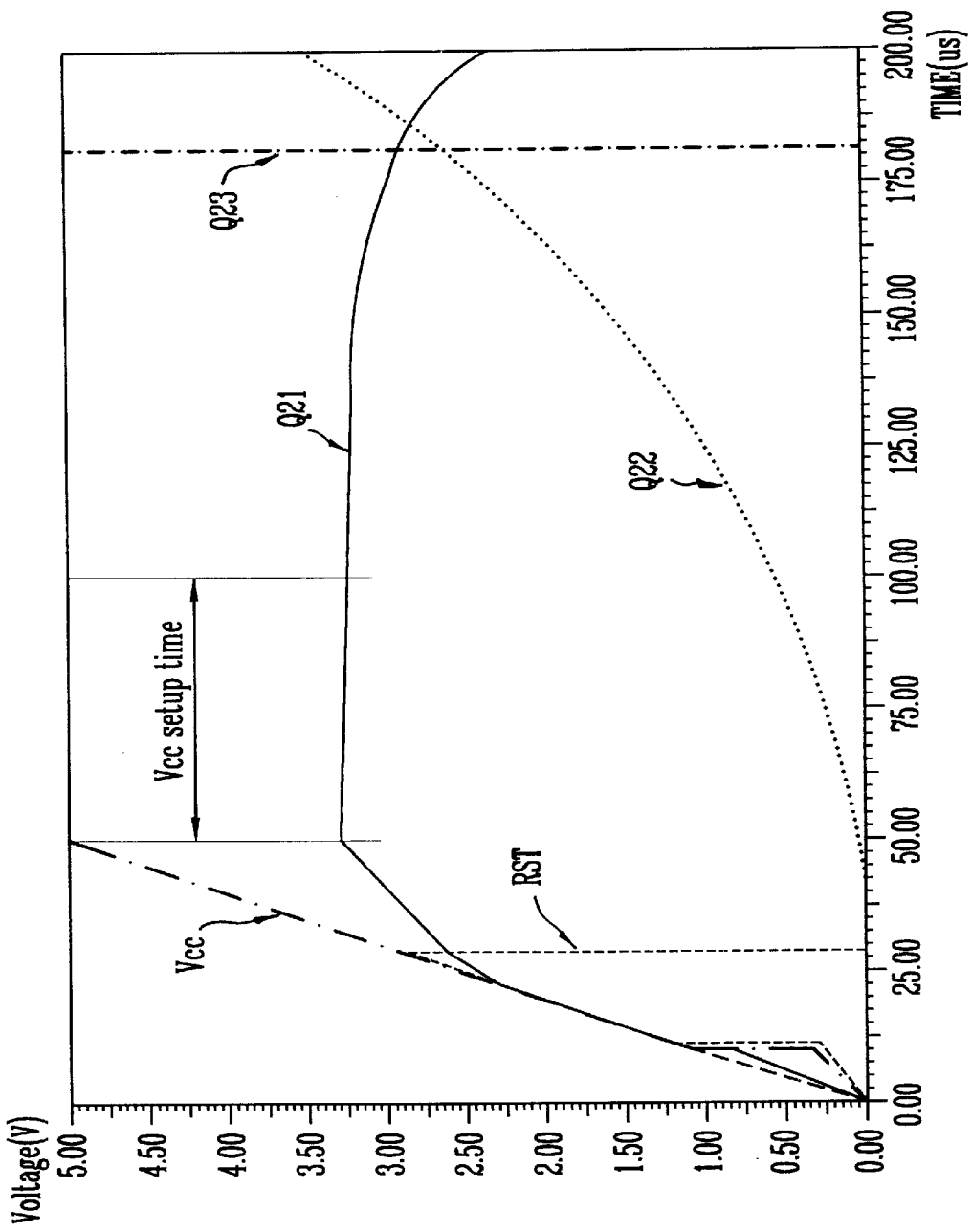

FIG. 6 is an output waveform of the power on reset circuit in accordance with the present invention when the ramp up time is 50μsec. In spite of a fast ramping time, the power on reset circuit in accordance with the present invention generates the reset signal, and by using this, the power supply voltage detecting unit will be described.

The power supply voltage detecting unit 10 is installed in order to solve problems that can occur when the power supply voltage Vcc is fast ramped. As shown in FIG. 6, in case where the ramp up time of the power supply voltage is 50 μsec, since the first node Q1 maintains approximately 3.5 V after the power supply voltage level is fully increased and the second to fourth PMOS transistors P22 to P24 is in a weakly turned-on state, a time is passed until the second node Q22 becomes a high state. After 50 μsec from the setup of the power supply voltage Vcc, the chip should be in an operable state. However, if a long time is passed until the second node Q22 becomes a high state, the reset signal is continuously outputted as a high state at the period of chip operation, thereby causing an erroneous operation of the chip. Accordingly, the third node Q3 is continuously maintained at a high state even after the setup time of the power supply voltage. If the potential of the third node Q3 is used as the power on reset signal, as described above, the chip operates erroneously. Accordingly, as shown in FIG. 4, by installing the power supply voltage detecting unit 10, when the third node Q23 is in a high state, the potential of the third node Q23 is detected in a state of a predetermined level by using the potential of the third node Q23 as an enable signal of the power supply voltage detecting unit 10. From this, the signal inputted to the transfer gate is controlled to a low state to turn off the transfer gate so that the potential of the third node Q23 is prevented from being outputted and the power on reset signal is outputted as a low state by using the fourth NMOS transistor N24.

Figure 7A:
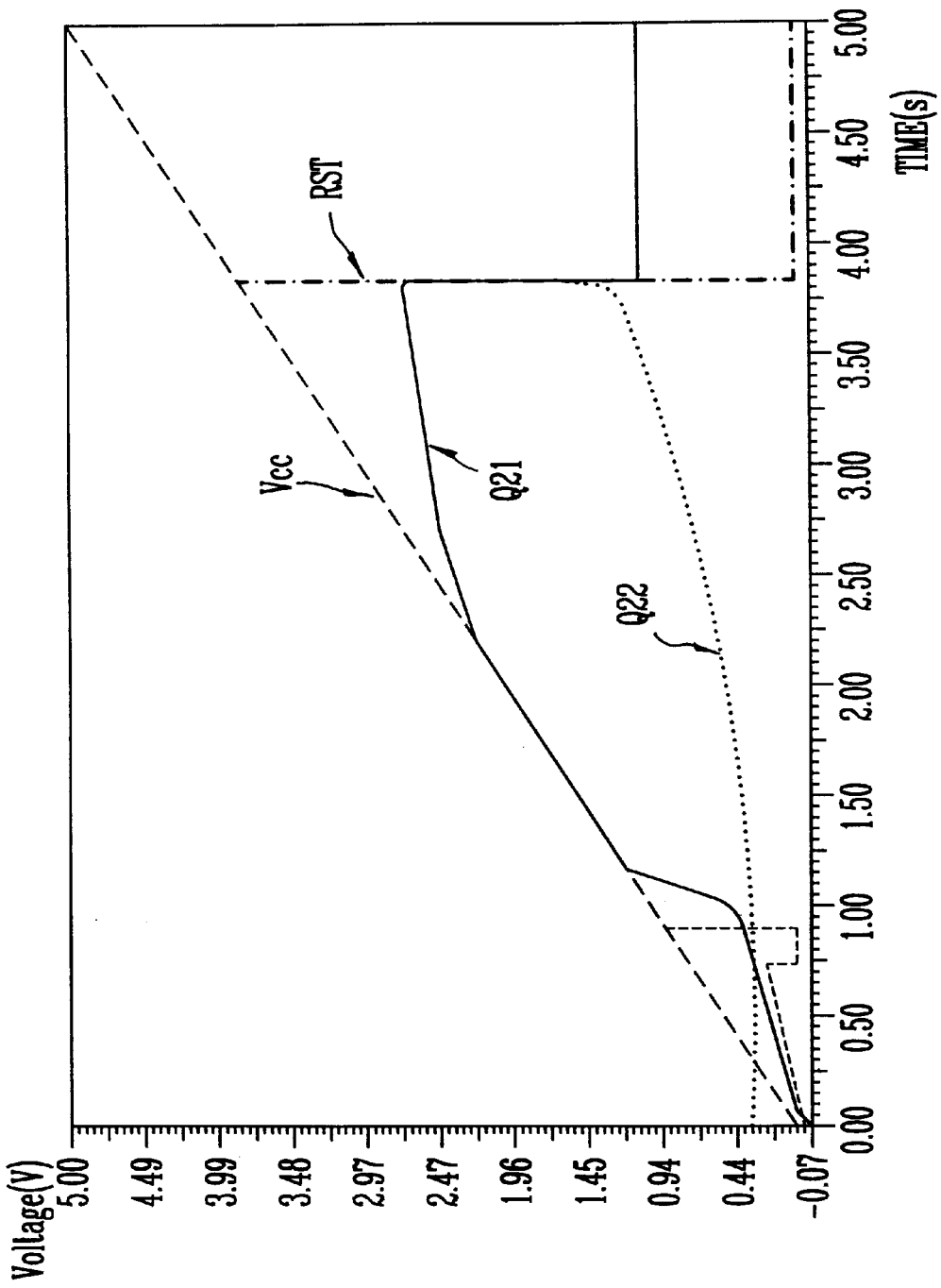
FIGS. 7A and 7B are waveforms explaining an operation of a power on reset circuit according to a variation of a model parameter.
Figure 7B:
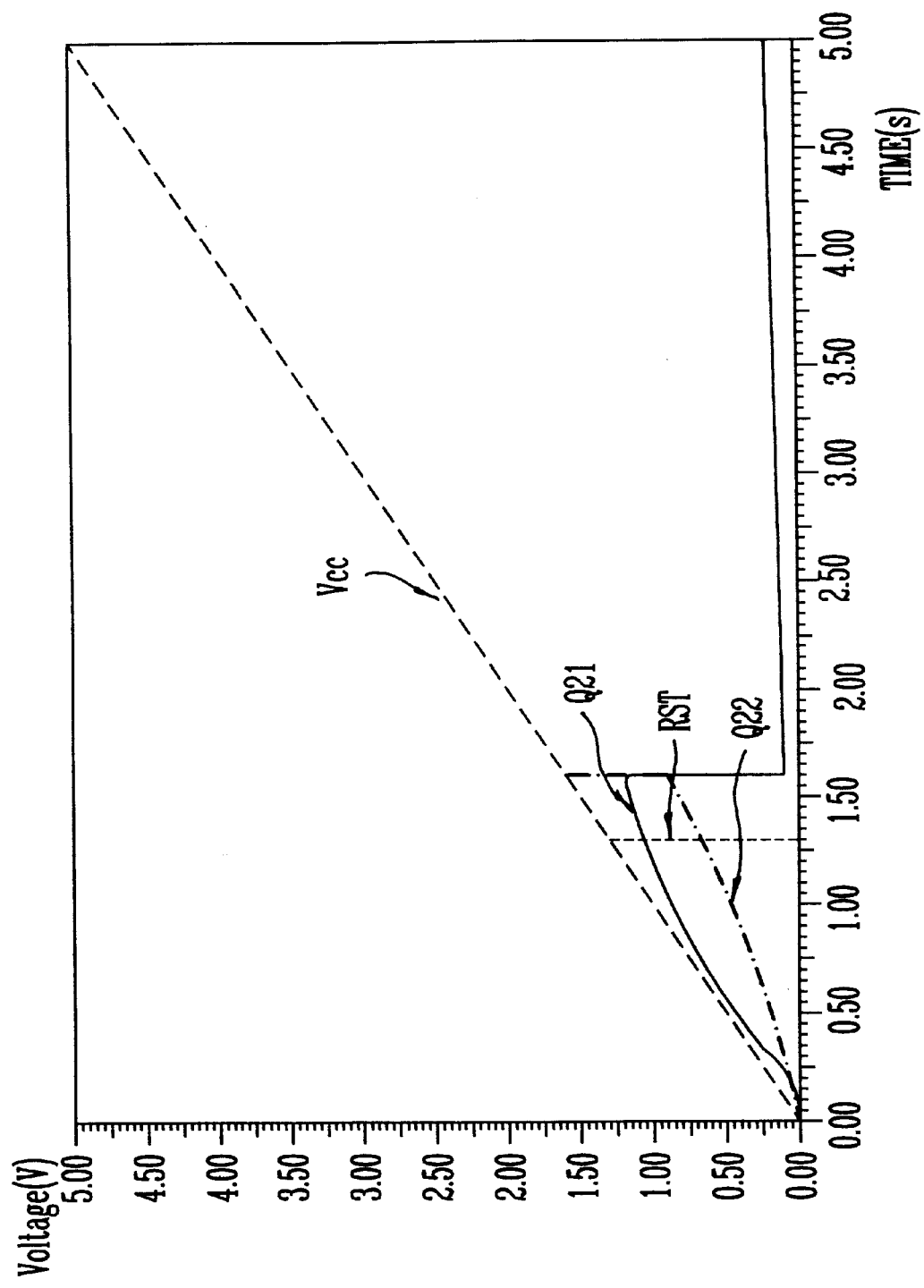

FIGS. 7A and 7B are waveforms of the power on reset circuit in accordance with the present invention according to a variation of a model parameter when the ramp up time is 5000 msec. Unlikely to the conventional power on reset circuit, the power on reset circuit in accordance with the present invention operates in spite of the variation of the model parameter in a slow ramping As described above, regardless of the ramp up time of the power supply voltage, the power on reset signal is generated, so that the erroneous operation is prevented and therefore, the reliability of the device is improved.

What is claimed is:

1. A power on reset circuit, comprising:
   a first means for controlling a potential of a first node to a first potential according to a potential of a second node;
   a second means for supplying a power supply voltage to be ramped up to the second node according to the potential of the first node;
   a third means for determining a potential of a third node by inverting and delaying the potential of the second node;
   a fourth means for controlling a potential of a fourth node to a second potential according to the potential of the third node;
   a fifth means for inverting and delaying the potential of the fourth node;
   a sixth means for outputting the potential of the third node to an output terminal according to an output signal from said fifth means and its inverted signal; and
   a seventh means for controlling a signal of the output terminal according to the inverted signal of the output signal from said fifth means.

2. The power on reset circuit as recited in claim 1, further comprising:
   an NMOS transistor, coupled between a power terminal and the second node, for supplying the power supply voltage according to the potential of the second node; and
   a capacitor, coupled between the second node and a ground terminal.

3. The power on reset circuit as recited in claim 1, wherein said first means includes:
   a PMOS transistor, coupled between the power terminal and the first node, for supplying the power supply voltage to the first node according to the potential of the second node; and
   a first NMOS transistor coupled between the second node and the ground terminal, wherein said first NMOS transistor is driven according to the potential of the second node; and
   a second NMOS transistor driven according to an output of said first NMOS transistor.

4. The power on reset circuit as recited in claim 1, wherein said second means includes:
   a plurality of PMOS transistors coupled between the power terminal and the second node, wherein the plurality of PMOS transistors are driven according to the potential of the first node.

5. The power on reset circuit as recited in claim 1, wherein said fourth means includes:
   a PMOS transistor for supplying the power supply voltage to the fourth node according to the potential of the third node; and
   a power supply voltage detecting means for controlling the potential of the fourth node according to the potential of the fourth node and the potential of the third node.

6. The power on reset circuit as recited in claim 5, wherein said power supply voltage detecting means includes:
   a PMOS transistor, coupled between the power terminal and the fourth node, for supplying the power supply voltage to the fourth node according to the potential of the fourth node; and
   a NMOS transistor, coupled between the fourth node and the ground terminal, for dropping the potential of the fourth node to the ground voltage according to the potential of the third node.

7. The power on reset circuit as recited in claim 1, wherein said sixth means is a transfer gate.

8. The power on reset circuit as recited in claim 1, wherein said seventh means is an NMOS transistor.

9. A power on reset circuit, comprising:
   a first circuit for controlling a potential of a first node to a first potential according to a potential of a second node;

a second circuit for supplying a power supply voltage to be ramped up to the second node according to the potential of the first node;

a third circuit for determining a potential of a third node by inverting and delaying the potential of the second node;

a fourth circuit for controlling a potential of a fourth node to a second potential according to the potential of the third node;

a fifth circuit for inverting and delaying the potential of the fourth node;

a sixth circuit for outputting the potential of the third node to an output terminal according to an output signal from said fifth circuit and its inverted signal; and a seventh circuit for controlling a signal of the output terminal according to the inverted signal of the output signal from said fifth circuit.

* * * * *